(12) United States Patent
Tong

(10) Patent No.: US 10,204,965 B2
(45) Date of Patent: Feb. 12, 2019

(54) ORGANIC LIGHT EMITTING DIODE DISPLAY PANELS AND MANUFACTURING METHODS THEREOF, DISPLAY DEVICES

(71) Applicant: Wuhan China Star Optoelectronics Technology Co., Ltd., Wuhan, Hubei (CN)

(72) Inventor: Peiqian Tong, Guangdong (CN)

(73) Assignee: Wuhan China Star Optoelectronics Technology Co., Ltd., Wuhan, Hubei (CN)

(*) Notice: Subject to any disclaimer, the term of this patent is extended or adjusted under 35 U.S.C. 154(b) by 95 days.

(21) Appl. No.: 15/518,479

(22) PCT Filed: Mar. 13, 2017

(86) PCT No.: PCT/CN2017/076478
§ 371 (c)(1),
(2) Date: Apr. 11, 2017

(87) PCT Pub. No.: WO2018/152881
PCT Pub. Date: Aug. 30, 2018

(65) Prior Publication Data
US 2018/0286928 A1    Oct. 4, 2018

(30) Foreign Application Priority Data
Feb. 27, 2017 (CN) .......................... 2017 1 0108162

(51) Int. Cl.
*H01L 27/12* (2006.01)
*H01L 27/32* (2006.01)
(Continued)

(52) U.S. Cl.
CPC ........ *H01L 27/3211* (2013.01); *G09G 3/3208* (2013.01); *H01L 27/1214* (2013.01);
(Continued)

(58) Field of Classification Search
CPC .............. G09G 3/3208; H01L 27/3211; H01L 27/3232
See application file for complete search history.

(56) References Cited

U.S. PATENT DOCUMENTS

| 2013/0075761 A1* | 3/2013 | Akiyama | H01L 27/288 257/80 |
| 2014/0225087 A1* | 8/2014 | Fang | H01L 27/288 257/40 |

(Continued)

FOREIGN PATENT DOCUMENTS

| CN | 103035664 A | 4/2013 |
| CN | 104218052 A | 12/2014 |

(Continued)

*Primary Examiner* — Kevin M Nguyen
(74) *Attorney, Agent, or Firm* — Andrew C. Cheng

(57) ABSTRACT

The present disclosure relates to an OLED display panel, including: a thin-film transistor (TFT) array substrate, wherein the TFT array substrate includes a plurality of pixel areas arranged in a matrix and a non-pixel area configured to be outside of the pixel areas, at least one pixel structure formed on the TFT array substrate, wherein each of the pixel structure corresponds to one pixel area, and an organic photovoltaic formed on the corresponding non-pixel area. The present disclosure further relates a manufacturing method of the OLED display panel, including: providing a TFT substrate defined with a plurality of pixel areas and a non-pixel area; forming at least one pixel structure on the pixel areas by adopting a first mask plate to apply a thin film deposition process; forming an organic photovoltaic on the non-pixel area by adopting a second mask plate to apply the thin film deposition process.

14 Claims, 4 Drawing Sheets

(51) Int. Cl.
    *H01L 51/50*     (2006.01)
    *H01L 51/52*     (2006.01)
    *H01L 51/56*     (2006.01)
    *G09G 3/3208*     (2016.01)
    *H01L 27/142*     (2014.01)

(52) U.S. Cl.
    CPC ........ *H01L 27/142* (2013.01); *H01L 27/3227* (2013.01); *H01L 27/3244* (2013.01); *H01L 51/5056* (2013.01); *H01L 51/5072* (2013.01); *H01L 51/5206* (2013.01); *H01L 51/5221* (2013.01); *H01L 51/56* (2013.01)

(56) References Cited

U.S. PATENT DOCUMENTS

| | | | |
|---|---|---|---|
| 2015/0053939 A1* | 2/2015 | Adamovich | H01L 51/0054 257/40 |
| 2015/0122324 A1* | 5/2015 | Eisaman | H01L 51/0057 136/256 |

FOREIGN PATENT DOCUMENTS

| | | | |
|---|---|---|---|
| CN | 105761629 A | 7/2016 | |
| CN | 205751390 U | 11/2016 | |

* cited by examiner

ORGANIC LIGHT EMITTING DIODE DISPLAY PANELS AND MANUFACTURING METHODS THEREOF, DISPLAY DEVICES

BACKGROUND OF THE INVENTION

1. Field of the Invention

The present disclosure relates to display field, more particularly to an organic emissive diode (OLED) display panel, a manufacturing method thereof, and a device including the OLED display panel.

2. Discussion of the Related Art

OLED display devices are characterized by attributes such as self-luminous, wide viewing angle, low power consuming, short response time, good low temperature characteristics, simple manufacturing process, and low cost. Flexible OLED display devices have significant impact on the application of wearable equipment due to the attributes such as light weight, flexible, and portable. Flexible OLED display devices may be adopted more widely as the personal intelligence terminals continue to develop. with respect to wearable devices or intelligent mobile terminals, the corresponding battery power consumption increases due to the increasing number of functions in such devices. Customers consider the standby time of the devices as an important criteria when selecting products. Therefore, how to improve the standby time of the equipment is a problem to be solved in the industry.

SUMMARY

The present disclosure relates to an OLED display panel and a manufacturing method thereof. The OLED display panel may generate power effectively by the ambient light and may assist in providing the power required for standby of the OLED display device, so as to increase the standby time of the product and to enhance the competitiveness.

In one aspect, the OLED display panel, including: a thin-film transistor (TFT) array substrate, wherein the TFT array substrate includes a plurality of pixel areas arranged in a matrix and a non-pixel area configured to be outside of the pixel areas, at least one pixel structure formed on the TFT array substrate, wherein each of the pixel structures corresponds to one pixel area, and an organic photovoltaic formed on the corresponding non-pixel area.

The organic photovoltaic includes a first anode, an organic thin film active layer, and a first cathode arranged along a direction facing away from the TFT array substrate layer by layer in sequence.

An anode buffer layer is arranged between the first anode and the organic thin film active layer, and a cathode modified layer is arranged between the first cathode and the organic thin film active layer.

The pixel structure includes a second anode, a hole transport function layer, a emissive layer, an electron transport function layer, and a second cathode arranged along a direction facing away from the TFT array substrate layer by layer in sequence.

The hole transport function layer includes a hole injection layer and a hole transport layer arranged along a direction facing away from the second anode in sequence, and the electron transport function layer includes an electron injection layer and an electron transport layer arranged along a direction facing away from the second cathode in sequence.

Each of the pixel structures respectively corresponds to a red subpixel, a green subpixel, or a blue subpixel; a emissive layer of the red subpixel is capable of emitting red light beams, an emissive layer of the green subpixel is capable of emitting green light beams, and an emissive layer of the blue subpixel is capable of emitting blue light beams.

The TFT substrate is a flexible TFT array substrate.

The present further relates to a manufacturing method of the OLED display panel, including: providing a TFT substrate defined with a plurality of pixel areas and a non-pixel area; forming at least one pixel structure on the pixel areas area by adopting a first mask plate to apply a thin film deposition process; forming an organic photovoltaic on the non-pixel area by adopting a second mask plate to apply the thin film deposition process.

A transmission region of the second mask plate is complementary with a transmission region of the first mask plate, and a block region of the second mask plate is complementary with a block region of the first mask plate.

The present further relates to a display device, including: a driving unit and an OLED display panel, wherein the driving unit is configured to provide driving signals and configured to drive the OLED display panel to display images.

In view of the above, the present disclosure provides the OLED display panel and the manufacturing method thereof. With respect to the OLED display panel, the organic photovoltaic is formed on the non-pixel area that is configured to be outside of the pixel structure. The OLED display panel may generate power effectively by the ambient light and may assist in providing the power required for the standby of the OLED display device so as to increase the standby time of the product and to enhance the competitiveness.

DETAILED DESCRIPTION OF THE EMBODIMENTS

To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments.

In order to avoid the unnecessary function detailed description of the concept of the invention result in confusion, the figures merely illustrate the structure and/or steps relates to the present disclosure, and the other details which does not relate to the present disclosure may be omitted.

Figure 1:
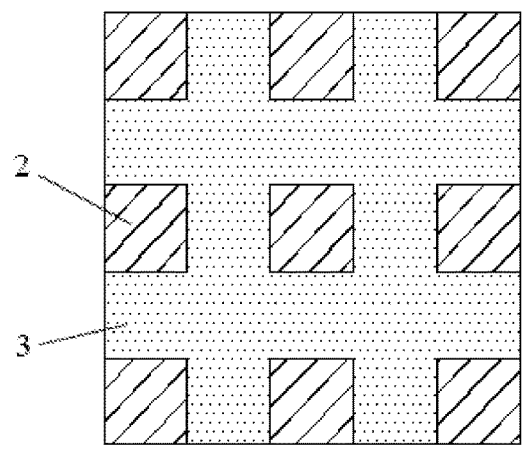
FIG. 1 is a top view of an OLED display panel in accordance with one embodiment of the present disclosure.
Figure 2:
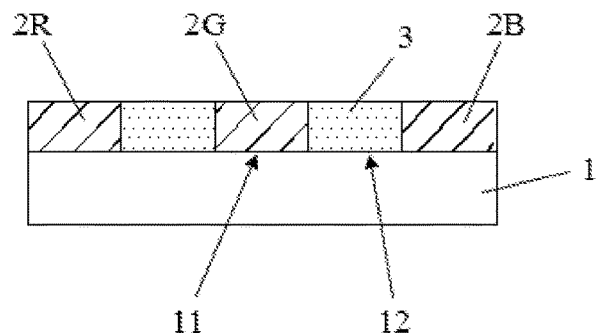
FIG. 2 is a side view of the OLED display panel in accordance with one embodiment of the present disclosure.
Figure 3:
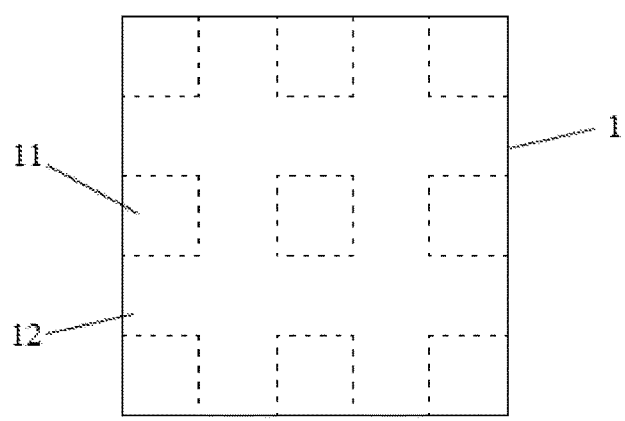
FIG. 3 is a schematic view of a TFT array substrate in accordance with one embodiment of the present disclosure.

The present disclosure provides an OLED display panel, referring to FIG. 1 to FIG. 3, the OLED display panel includes a thin-film transistor (TFT) array substrate 1, at least one pixel structure 2 formed on the TFT array substrate 1, and an organic photovoltaic (OPV) 3. Wherein, as shown in FIG. 3, the TFT array substrate 1 includes a plurality of pixel areas 11 arranged in a matrix and a non-pixel area 12 configured to be outside of the pixel areas 11. The non-pixel area 12 separates the two adjacent pixel areas 11 from each other. As shown in FIG. 1 and FIG. 2, on the TFT array substrate 1, each of the pixel structures 11 is formed corresponding to one pixel structure 2, and the organic photovoltaic 3 is formed on the corresponding non-pixel area 12.

Figure 4:
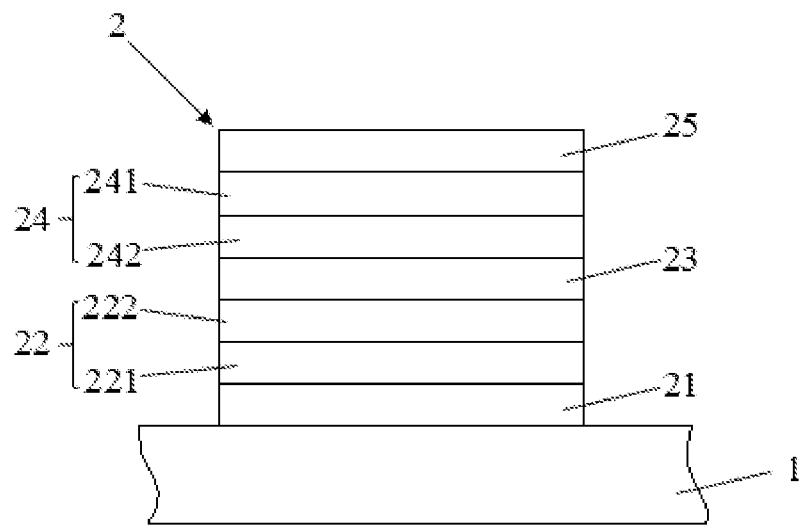
FIG. 4 is a schematic view of pixel structures configured on the TFT array substrate in accordance with one embodiment of the present disclosure.

Specifically, as shown in FIG. 4, the pixel structure 2 includes a second anode 21, a hole transport function layer 22, an emissive layer (EML) 23, an electron transport function layer 24, and a second cathode 25 arranged along a direction facing away from the TFT array substrate 1 layer by layer in sequence. Wherein the hole transport function layer 22 includes a hole injection layer 221 and a hole transport layer 222 arranged along a direction facing away from the second anode 21 in sequence. The hole injection layer 221 and the hole transport layer 222 have similar functions, and may be collectively referred to as hole transport function layer 22. The electron transport function layer 24 includes an electron injection layer 241 and an electron transport layer 242 arranged along a direction facing away from the second cathode 25 in sequence. The electron injection layer 241 and the electron transport layer 242 have similar functions, and may be collectively referred to as the electron transport function layer 24.

The operation principle of the OLED display panels is that when applying a electric field between the second anode 21 and the second cathode 25, a least one hole is transported to the emissive layer 23 via the hole transport function layer 22, and at least one electron is transported to the emissive layer 23 via the electron transport function layer 24. The holes and the electrons are combined within the emissive layer 23 to emit light beams. Usually, the OLED display panel displays different colors by a mixture of three primary colors R, G, B. Therefore, each of pixels on the OLED display panel has three light-emitting units including R, G, B. i.e., as shown in FIG. 2, each of the pixel structures 2 respectively corresponds to a red subpixel 2R, a green subpixel 2G or a blue subpixel 2B. The red subpixel 2R, the green subpixel 2G, and the blue subpixel 2B are arranged in sequence to form one pixel cell. Wherein an emissive layer of the red subpixel 2R is capable of emitting red light beams, an emissive layer of the green subpixel 2G is capable of emitting green light beams, and an emissive layer of the blue subpixel 2B is capable of emitting blue light beams. Usually, the three light-emitting units R, G, B configured in each of the pixel cells can be driven separately via a separate control of a driving circuit.

Figure 5:
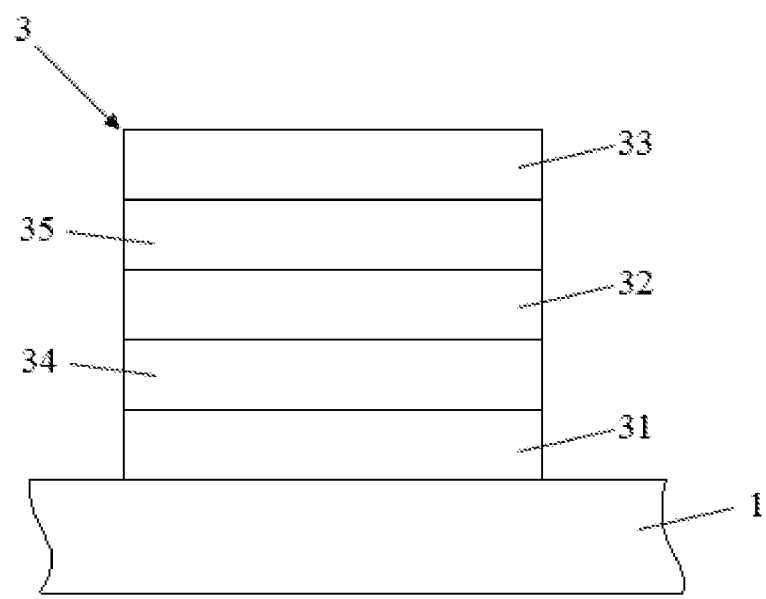
FIG. 5 is a schematic view of a photovoltaic cell configured on the TFT array substrate in accordance with one embodiment of the present disclosure.

Specifically, as shown in FIG. 5, the organic photovoltaic 3 includes a first anode 31, an organic thin film active layer 32, and a first cathode 33 arranged along a direction facing away from the TFT array substrate 1 layer by layer in sequence. The operation principle of the organic photovoltaic includes following steps: (1) Under an irradiation of a ambient light, such as sun light, photons whose energy is greater than a band gap of the organic semiconductor material (active layer) are first absorbed, at this time, electrons in the HOMO (the highest occupied orbit of the material) level are excited to the LUMO (the lowest vacant orbit of the material) level, while associated holes occupy the lower HOMO level of the orbit; (2) Coulomb force formed between electron-hole pairs is greater, and the electron-hole pairs is in a binding form, referred to as exciton. (3) When the exciton is within the electric field or at the interface, the exciton separates and forms free electron and free hole due to the energy gap, and the free electrons and free holes move to the cathode and the anode respectively to form a photocurrent. Further, to collect the photocurrent better, as shown in FIG. 5, an anode buffer layer 34 is arranged between the first anode 31 and the organic thin film active layer 32, and a cathode modified layer 35 is arranged between the first cathode 33 and the organic thin film active layer 32.

The organic photovoltaic 3 adopts the ambient light to generate the photocurrent and to transmit to a power supply circuit of an OLED display device, wherein the photocurrent is configured to assist in providing the power required for standby of the OLED display device, such that to increase the standby time of the product and to enhance the competitiveness.

In one embodiment, the TFT substrate 1 is a flexible TFT array substrate. Whereby a flexible OLED display panel is formed which can be applied to a wearable device or an intelligent mobile terminal.

Figure 6:
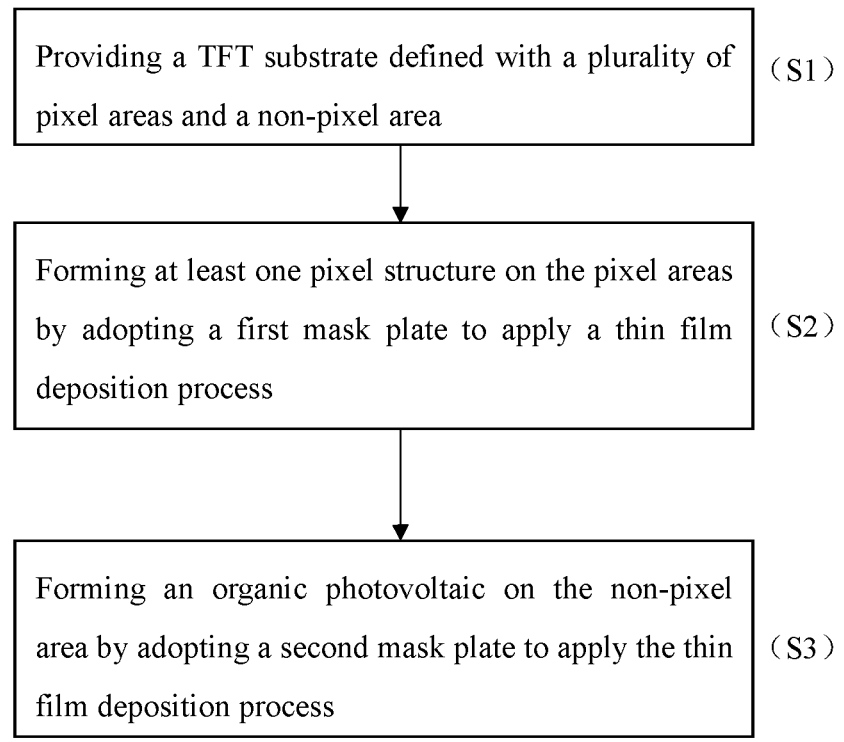
FIG. 6 is a flowchart illustrating the process of manufacturing methods of OLED display panels in accordance with one embodiment of the present disclosure.

In another aspect, a manufacturing method of the OLED display panels, as shown in FIG. 6, wherein the steps include:

S1. Providing the TFT substrate 1 defined with the pixel areas 11 and the non-pixel area 12.

Figure 7A:
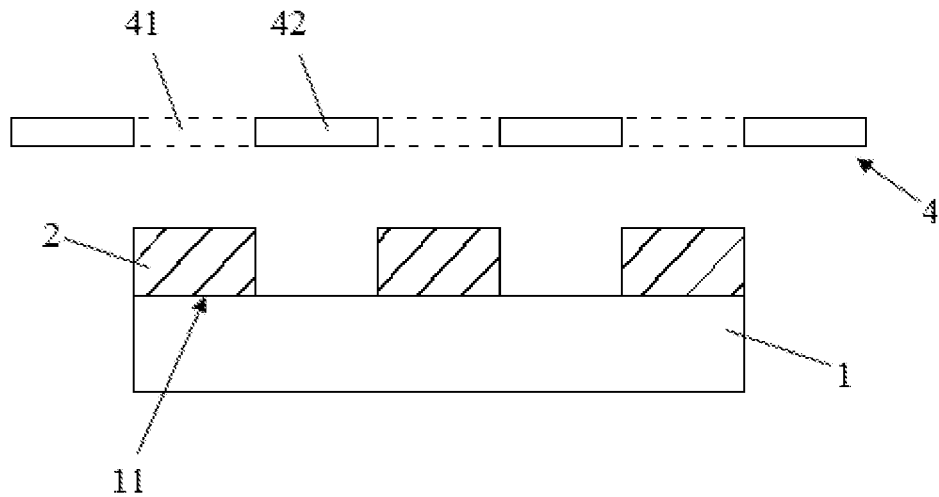
FIG. 7a and FIG. 7b are examples illustrating the process of manufacturing methods in accordance with the embodiments of the present disclosure.

S2. Referring to FIG. 7a, forming the pixel structure 2 on the pixel areas 11 by adopting a first mask plate 4 to apply a thin film deposition process, wherein the first mask plate 4 includes a transmission region 41 and a block region 42; applying a vapor deposition process from a top of the first mask plate 4 toward the TFT substrate 1 to deposit the materials of each functional layers; obtaining the pixel structure 2 by depositing each of the functional layers on the TFT substrate 1 through the transmission region 41.

Figure 7B:
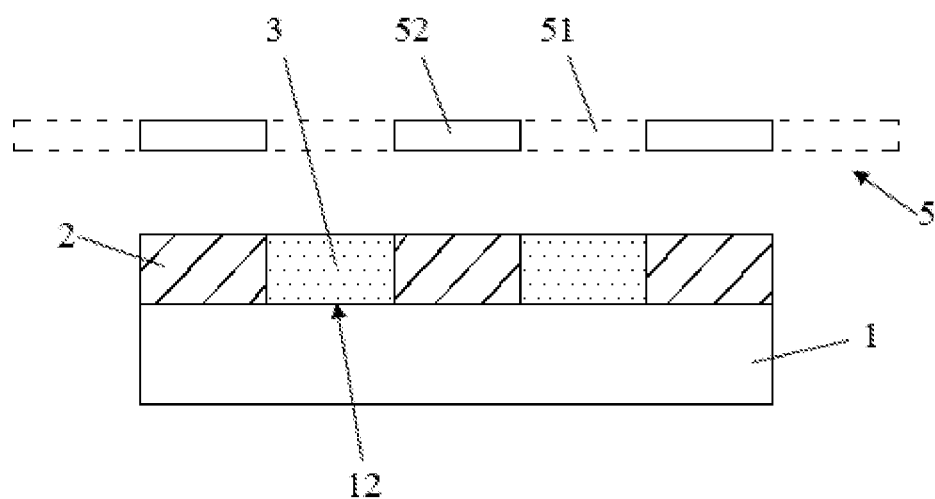

S3. Referring to FIG. 7b, forming the organic photovoltaic 3 on the non-pixel area 12 by adopting a second mask plate 5 to apply the thin film deposition process, wherein the second mask plate 5 includes a transmission region 51 and a block region 52; applying the vapor deposition process from a top of the second mask plate 5 toward the TFT substrate 1 to deposit the materials of each functional layers of the organic photovoltaic 3; obtaining the organic photovoltaic 3 by depositing each of the functional layers on the TFT substrate 1 through the transmission region 51. Specifically, in one embodiment, the transmission region 51 of the second mask plate 5 is complementary with the transmission region 41 of the first mask plate 4, and the block region 52 of the second mask plate 5 is complementary with the block region 42 of the first mask plate 4, i.e., the transmission region 51 of the second mask plate 5 corresponds to the block region 42 of the first mask plate 4, and the block region 52 of the second mask plate 5 corresponds to the transmission region 41 of the first mask plate 4. Therefore, the pixel structure 2 of the TFT substrate 1 and the organic photovoltaic 3 do not overlap with each other, and the organic photovoltaic 3 is filled with all the regions except the pixel structure 2.

Figure 8:
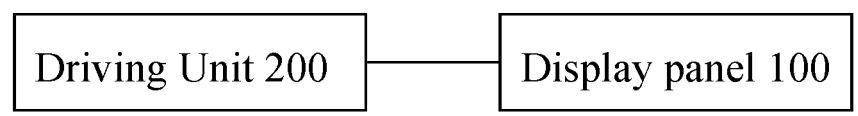
FIG. 8 is a schematic view of a display device in accordance with one embodiment of the present disclosure.

In another aspect, as shown in FIG. 8, a display device, including a driving unit 200 and a display panel 100, wherein the driving unit 200 is configured to provide driving signals and configured to drive the display panel 100 to display images, and the display panel 100 includes the OLED display panel described as above.

In view of the above, the present disclosure provides the OLED display panel. The organic photovoltaic is formed on the non-pixel area that is configured to be outside of the pixel structure. The OLED display panel may generate power effectively by the ambient light and may assist in providing the power required for standby of the OLED display device so as to increase the standby time of the product and to enhance the competitiveness.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . ." does not exclude the presence of additional identical elements in the process, method, article or device that comprises the said element The above embodiments are provided to explain the principles of the invention and its practical application, thereby enabling other person skilled in the art to understand each of the embodiments in the invention and various modifications being suitable for the particular application.

What is claimed is:

1. An organic emissive diode (OLED) display panel, comprising:
   a thin-film transistor (TFT) array substrate, wherein the TFT array substrate comprises a plurality of pixel areas arranged in a matrix and a non-pixel area configured to be outside of the pixel areas;
   at least one pixel structure formed on the TFT array substrate, wherein each of the pixel structures corresponds to one pixel area;
   an organic photovoltaic formed on the corresponding non-pixel area;
   wherein the organic photovoltaic comprises a first anode, an organic thin film active layer, and a first cathode arranged along a direction facing away from the TFT array substrate layer by layer in sequence;
   wherein the pixel structure comprises a second anode, a hole transport function layer, an emissive layer, an electron transport function layer, and a second cathode arranged along a direction facing away from the TFT array substrate layer by layer in sequence; and
   wherein the first anode of the organic photovoltaic and the second anode of the pixel structure are arranged on the same layer on the TFT array substrate.

2. The OLED display panel according to claim 1, wherein an anode buffer layer is arranged between the first anode and the organic thin film active layer, and a cathode modified layer is arranged between the first cathode and the organic thin film active layer.

3. The OLED display panel according to claim 1, wherein the hole transport function layer comprises a hole injection layer and a hole transport layer arranged along a direction facing away from the second anode in sequence; the electron transport function layer comprises an electron injection layer and an electron transport layer arranged along a direction facing away from the second cathode in sequence.

4. The OLED display panel according to claim 1, wherein each of the pixel structures respectively corresponds to a red subpixel, a green subpixel, or a blue subpixel; an emissive layer of the red subpixel is capable of emitting red light beams, an emissive layer of the green subpixel is capable of emitting green light beams, and an emissive layer of the blue subpixel is capable of emitting blue light beams.

5. The OLED display panel according to claim 1, wherein the TFT substrate is a flexible TFT array substrate.

6. A manufacturing method of OLED display panels, comprising:
   providing a TFT substrate defined with a plurality of pixel areas and a non-pixel area;
   forming at least one pixel structure on the pixel areas by adopting a first mask plate to apply a thin film deposition process;
   forming an organic photovoltaic on the non-pixel area by adopting a second mask plate to apply the thin film deposition process;
   wherein the organic photovoltaic comprises a first anode, an organic thin film active layer, and a first cathode arranged along a direction facing away from the TFT array substrate layer by layer in sequence;
   wherein the pixel structure comprises a second anode, a hole transport function layer, an emissive layer, an electron transport function layer, and a second cathode arranged along a direction facing away from the TFT array substrate layer by layer in sequence; and
   wherein the first anode of the organic photovoltaic and the second anode of the pixel structure are arranged on the same layer on the TFT array substrate.

7. The manufacturing method of OLED display panels according to claim 6, wherein a transmission region of the second mask plate is complementary with a transmission region of the first mask plate, and a block region of the second mask plate is complementary with a block region of the first mask plate.

8. The manufacturing method of OLED display panels according to claim 6, wherein an anode buffer layer is arranged between the first anode and the organic thin film active layer, and a cathode modified layer is arranged between the first cathode and the organic thin film active layer.

9. The manufacturing method of OLED display panels according to claim 6, wherein the hole transport function layer comprises a hole injection layer and a hole transport layer arranged along a direction facing away from the second anode in sequence; the electron transport function layer comprises an electron injection layer and an electron transport layer arranged along a direction facing away from the second cathode in sequence.

10. A display device, comprising: a driving unit and an OLED display panel, wherein the driving unit is configured to provide driving signals and configured to drive the OLED display panel to display images; the OLED display panel comprises:
   a thin-film transistor (TFT) array substrate, wherein the TFT array substrate comprises a plurality of pixel areas arranged in a matrix and a non-pixel area configured to be outside of the pixel areas;
   at least one pixel structure formed on the TFT array substrate, wherein each of the pixel structure corresponds to one pixel area;
   an organic photovoltaic formed on the corresponding non-pixel area;

wherein the organic photovoltaic comprises a first anode, an organic thin film active layer, and a first cathode arranged along a direction facing away from the TFT array substrate layer by layer in sequence;

wherein the pixel structure comprises a second anode, a hole transport function layer, an emissive layer, an electron transport function layer, and a second cathode arranged along a direction facing away from the TFT array substrate layer by layer in sequence; and wherein the first anode of the organic photovoltaic and the second anode of the pixel structure are arranged on the same layer on the TFT array substrate.

11. The display device according to claim 10, wherein an anode buffer layer is arranged between the first anode and the organic thin film active layer, and a cathode modified layer is arranged between the first cathode and the organic thin film active layer.

12. The display device according to claim 10, wherein the hole transport function layer comprises a hole injection layer and a hole transport layer arranged along a direction facing away from the second anode in sequence; the electron transport function layer comprises a electron injection layer and an electron transport layer arranged along a direction facing away from the second cathode in sequence.

13. The display device according to claim 10, wherein each of the pixel structures respectively corresponds to a red subpixel, a green subpixel, or a blue subpixel; an emissive layer of the red subpixel is capable of emitting red light beams, an emissive layer of the green subpixel is capable of emitting green light beams, and an emissive layer of the blue subpixel is capable of emitting blue light beams.

14. The display device according to claim 10, wherein the TFT substrate is a flexible TFT array substrate.

* * * * *